US012660085B2

(12) United States Patent
Kagohashi et al.

(10) Patent No.: US 12,660,085 B2
(45) Date of Patent: Jun. 16, 2026

(54) PRINTED WIRING BOARD

(71) Applicant: IBIDEN CO., LTD., Ogaki (JP)

(72) Inventors: Susumu Kagohashi, Ogaki (JP);
Kyohei Yoshikawa, Ogaki (JP);
Takuya Inishi, Ogaki (JP); Jun Sakai,
Ogaki (JP)

(73) Assignee: IBIDEN CO., LTD., Ogaki (JP)

( * ) Notice: Subject to any disclaimer, the term of this
patent is extended or adjusted under 35
U.S.C. 154(b) by 181 days.

(21) Appl. No.: 18/585,113

(22) Filed: Feb. 23, 2024

(65) Prior Publication Data

US 2024/0292536 A1      Aug. 29, 2024

(30) Foreign Application Priority Data

Feb. 24, 2023      (JP) ................................. 2023-027470

(51) Int. Cl.
| | |
|---|---|
| *H05K 1/00* | (2006.01) |
| *H05K 1/09* | (2006.01) |
| *H05K 1/11* | (2006.01) |
| *H05K 3/00* | (2006.01) |
| *H05K 3/42* | (2006.01) |
| *H05K 1/03* | (2006.01) |

(52) U.S. Cl.
CPC .............. *H05K 1/116* (2013.01); *H05K 1/09*
(2013.01); *H05K 3/0035* (2013.01); *H05K*
*3/0041* (2013.01); *H05K 3/423* (2013.01);
*H05K 1/0373* (2013.01); *H05K 2201/0209*
(2013.01)

(58) Field of Classification Search
CPC ........ H05K 1/116; H05K 1/09; H05K 3/0035;
H05K 3/0041; H05K 3/423; H05K
1/0373; H05K 2201/0209
See application file for complete search history.

(56) References Cited

U.S. PATENT DOCUMENTS

| | | | |
|---|---|---|---|
| 2006/0088436 A1* | 4/2006 | Okabe ................. | C23C 14/3414 |
| | | | 420/490 |
| 2022/0071016 A1* | 3/2022 | Hwang .................. | H05K 3/427 |
| 2022/0230912 A1* | 7/2022 | Kim ........................ | H01L 24/94 |

FOREIGN PATENT DOCUMENTS

JP            2015-126103 A       7/2015

OTHER PUBLICATIONS

CN 102281700 A; published in 2011 (Year: 2011).*

* cited by examiner

*Primary Examiner* — Pete T Lee
(74) *Attorney, Agent, or Firm* — Finnegan, Henderson,
Farabow, Garrett & Dunner, LLP

(57)      ABSTRACT

A printed wiring board includes a first conductor layer, a
resin insulating layer including resin and inorganic particles,
a second conductor layer including a seed layer and an
electrolytic plating layer on the seed layer, and a via con-
ductor connecting the first conductor layer and second
conductor layer and including the seed layer and electrolytic
plating layer extending from the second conductor layer. The
second conductor layer and via conductor are formed such
that the seed layer includes an alloy including copper,
aluminum and a metal including one or more metals selected
from nickel, zinc, gallium, silicon and magnesium, and the
resin insulating layer is formed such that the inorganic
particles include first inorganic particles forming an inner
wall surface in the opening and second inorganic particles
embedded in the resin insulating layer and that shapes of the
first inorganic particles are different from shapes of the
second inorganic particles.

20 Claims, 4 Drawing Sheets

PRINTED WIRING BOARD

CROSS-REFERENCE TO RELATED APPLICATIONS

The present application is based upon and claims the benefit of priority to Japanese Patent Application No. 2023-027470, filed Feb. 24, 2023, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2015-126103 describes a printed wiring board having a first conductor layer, an insulating layer formed on the first conductor layer, and a second conductor layer formed on the insulating layer. The entire contents of this publication are incorporated herein by reference.

SUMMARY OF THE INVENTION

According to one aspect of the present invention, a printed wiring board includes a first conductor layer, a resin insulating layer formed on the first conductor layer and including resin and inorganic particles, a second conductor layer formed on the resin insulating layer and including a seed layer and an electrolytic plating layer formed on the seed layer, and a via conductor formed in an opening formed in the resin insulating layer such that the via conductor is connecting the first conductor layer and the second conductor layer and includes the seed layer and electrolytic plating layer extending from the second conductor layer. The second conductor layer and via conductor are formed such that the seed layer includes an alloy including copper, aluminum and a metal including one or more metals selected from nickel, zinc, gallium, silicon and magnesium, and the resin insulating layer is formed such that the inorganic particles include first inorganic particles forming an inner wall surface in the opening and second inorganic particles embedded in the resin insulating layer and that shapes of the first inorganic particles are different from shapes of the second inorganic particles.

According to another aspect of the present invention, a method for manufacturing a printed wiring board includes providing a resin insulating layer formed on a first conductor layer such that the resin insulating layer includes resin and inorganic particles, forming an opening in the resin insulating layer such that a portion of the inorganic particles has protruding portions protruding from an inner wall surface in the opening, and removing the protruding portions of the inorganic particles such that the inorganic particles include first inorganic particles forming the inner wall surface in the opening and second inorganic particles embedded in the resin insulating layer, forming a second conductor layer on the resin insulating layer such that the forming of the second conductor layer includes forming a seed layer and forming an electrolytic plating layer on the seed layer, and forming a via conductor in the opening formed in the resin insulating layer such that the via conductor connects the first conductor layer and the second conductor layer and includes the seed layer and electrolytic plating layer extending from the second conductor layer. The second conductor layer and via conductor are formed such that the seed layer includes an alloy including copper, aluminum and one or more metals selected from nickel, zinc, gallium, silicon and magnesium, and the resin insulating layer is formed such that shapes of the first inorganic particles are different from shapes of the second inorganic particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
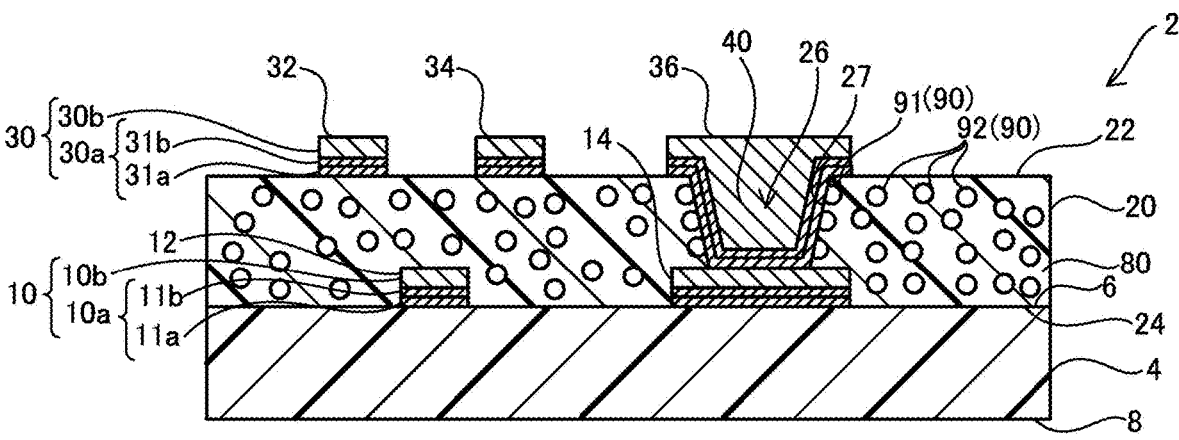
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
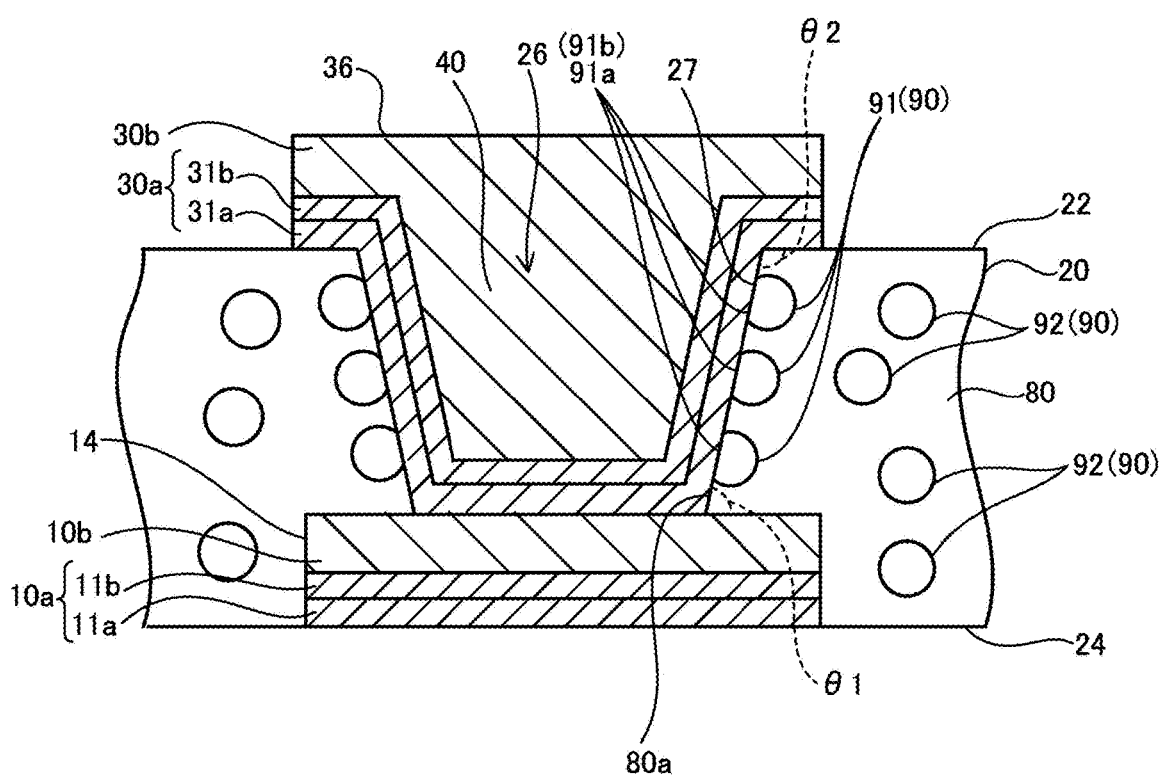
FIG. 2 is an enlarged cross-sectional view schematically illustrating a portion of a printed wiring board according to an embodiment of the present invention.

FIG. 1 is a cross-sectional view illustrating a printed wiring board 2 of an embodiment. FIG. 2 is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as glass particles. The insulating layer 4 may contain a reinforcing material such as a glass cloth. The insulating layer 4 has a third surface 6 and a fourth surface 8 on the opposite side with respect to the third surface 6.

The first conductor layer 10 is formed on the third surface 6 of the insulating layer 4. The first conductor layer 10 includes a signal wiring 12 and a pad 14. Although not illustrated in the drawings, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed by sputtering. The seed layer (10a) is formed of a first layer (11a) on the third surface 6 and a second layer (11b) on the first layer (11a). The first layer (11a) is in contact with the insulating layer 4. The second layer (11b) is not essential.

The first layer (11a) is formed of an alloy containing copper, aluminum, and a specific metal. Examples of specific metals include nickel, zinc, gallium, silicon, and magnesium. The alloy preferably contains one type of specific metal, or two types of specific metals, or three types of specific metals. The aluminum content in the alloy is 1.0 at % or more and 15.0 at % or less. An example of a specific metal is silicon. The content of the specific metal in the alloy is 0.5 at % or more and 10.0 at % or less. The first layer (11a) may contain impurities. Examples of the impurities are oxygen and carbon. The first layer (11a) can contain oxygen or carbon. The first layer (11a) can contain oxygen and carbon. In the embodiment, the alloy further contains carbon. The carbon content in the alloy is 50 ppm or less. The alloy further contains oxygen. The oxygen content in the alloy is 100 ppm or less. The values of the contents of the elements described above are examples. Among the elements that form the first layer (11a), the copper content is the largest. The aluminum content is the next largest. The content of the specific metal is less than the aluminum content. Therefore, copper is a primary metal, aluminum is a first secondary metal, and the specific metal is a second secondary metal. The content of the impurities is smaller than the content of the specific metal.

The second layer (11b) is formed of copper. A content of copper forming the second layer (11b) is 99.9 at % or more. The copper content in the second layer (11b) is preferably 99.95 at % or more. The electrolytic plating layer (10b) is formed of copper. A content of copper forming the electrolytic plating layer (10b) is 99.9 at % or more. The copper content in the electrolytic plating layer (10b) is preferably 99.95 at % or more.

The resin insulating layer 20 is formed on the third surface 6 of the insulating layer 4 and on the first conductor layer 10. The resin insulating layer 20 has a first surface 22 and a second surface 24 on the opposite side with respect to the first surface 22. The resin insulating layer 20 has an opening 26 that exposes the pad 14. The resin insulating layer 20 is formed of a resin 80 and a large number of inorganic particles 90 dispersed in the resin 80. The resin 80 is an epoxy resin. Examples of the resin include a thermosetting resin and a photocurable resin. The inorganic particles 90 are glass particles. The inorganic particles 90 may be alumina particles.

As illustrated in FIGS. 1 and 2, the inorganic particles 90 include first inorganic particles 91 forming an inner wall surface 27 of the opening 26 and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

As illustrated in FIG. 1, the first surface 22 of the resin insulating layer 20 is formed only of the resin 80. No inorganic particles 90 (the second inorganic particles 92) are exposed from the first surface 22. The first surface 22 does not include surfaces of the second inorganic particles 92. No unevenness is formed on the first surface 22 of the resin insulating layer 20. The first surface 22 is not roughened. The first surface 22 is formed smooth.

As illustrated in FIG. 2, the inner wall surface 27 of the opening 26 is formed of the resin 80 and the first inorganic particles 91. The first inorganic particles 91 each have a flat part (91a). The flat parts (91a) form the inner wall surface 27. The inner wall surface 27 is formed of the resin 80 and the flat parts (91a). The flat parts (91a) and a surface of the resin 80 that forms the inner wall surface 27 form substantially a common surface. No unevenness is formed on the resin 80 that forms the inner wall surface 27. The surface of the resin 80 that forms the inner wall surface 27 is smooth. No unevenness is formed on exposed surfaces of the flat parts (91a) (surfaces that form the inner wall surface 27). The exposed surfaces of the flat parts (91a) are smooth. The inner wall surface 27 is formed smooth. The inner wall surface 27 has an arithmetic mean roughness (Ra) of 1.0 μm or less.

The flat parts (91a) of the first inorganic particles 91 substantially coincides with a surface obtained by extending the surface (80a) of the resin 80 formed around the first inorganic particles 91 (a surface that forms the inner wall surface 27). The flat parts (91a) drawn with substantially straight lines in FIGS. 1 and 2 each mean a flat surface. In the cross sections illustrated in FIGS. 1 and 2, the flat parts (91a) are each a flat surface. It is also possible that the flat parts (91a) are not each a perfect flat surface. The flat parts (91a) are each substantially a flat surface and are each substantially a smooth surface.

As illustrated in FIG. 2, the inner wall surface 27 of the opening 26 is inclined. An angle (inclination angle) (θ1) between an upper surface of the pad 14 and the inner wall surface 27 is 70 degrees or more and 85 degrees or less. The upper surface of pad 14 is included in an upper surface of first conductor layer 10. An angle (inclination angle) (θ2) between the first surface 22 of the resin insulating layer 20 and the inner wall surface 27 is 95 degrees or more and 110 degrees or less.

In the cross-sections illustrated in FIGS. 1 and 2, the opening 26 is illustrated to have a substantially inverted trapezoidal shape. However, the opening 26 has actually a substantially inverted truncated cone shape. Therefore, the inner wall surface (side wall) 27 of the opening 26 is actually a substantially curved surface. That is, the common surface formed by the flat parts (91a) and the resin 80 includes the inner wall surface (side wall) 27 formed as a substantially curved surface.

As illustrated in FIG. 1, the second conductor layer 30 is formed on the first surface 22 of the resin insulating layer 20. The second conductor layer 30 includes a first signal wiring 32, a second signal wiring 34, and a land 36. Although not illustrated in the drawings, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30b) on the seed layer (30a). The seed layer (30a) is formed by sputtering. The seed layer (30a) is formed of a first layer (31a) on the first surface 22 and a second layer (31b) on the first layer (31a). The first layer (31a) is in contact with the first surface 22. The second layer (31b) is not essential.

The first layer (31a) that forms the second conductor layer 30 is similar to the first layer (11a) that forms the first conductor layer 10.

The second layer (31b) that forms the second conductor layer 30 is similar to the second layer (11b) that forms the first conductor layer 10. The electrolytic plating layer (30b) is formed of copper.

The via conductor 40 is formed in the opening 26. The via conductor 40 connects the first conductor layer 10 and the second conductor layer 30. In FIG. 1, the via conductor 40 connects the pad 14 and the land 36. The via conductor 40 is formed of a seed layer (30a) and an electrolytic plating layer (30b) on the seed layer (30a). The seed layer (30a) that forms the via conductor 40 and the seed layer (30a) that forms the second conductor layer 30 are common. The seed layer (30a) that forms the via conductor 40 is formed of a first layer (31a), which is formed on the inner wall surface 27 of the opening 26 and on the pad 14 exposed from the opening 26, and a second layer (31b) on the first layer (31a). The first layer (31a) is in contact with the upper surface of the pad 14 and the inner wall surface 27. The electrolytic plating layer (30b) that forms the via conductor 40 and the electrolytic plating layer (30b) that forms the second conductor layer 30 are common.

Figure 3A:
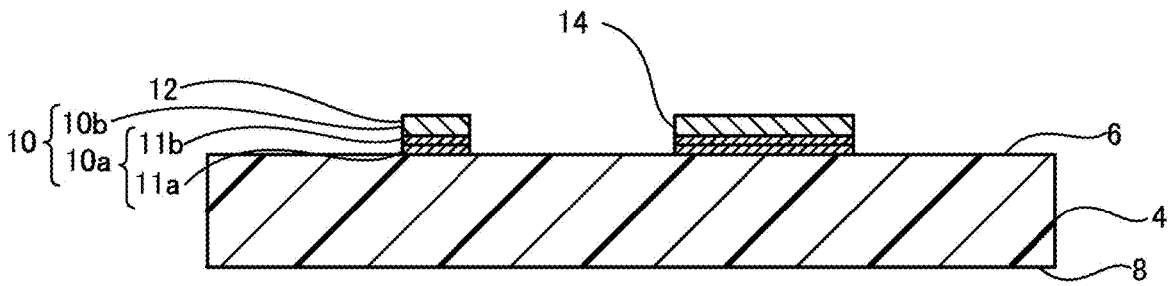
FIG. 3A is a cross-sectional view schematically illustrating a method for manufacturing a printed wiring board according to an embodiment of the present invention.
Figure 3B:
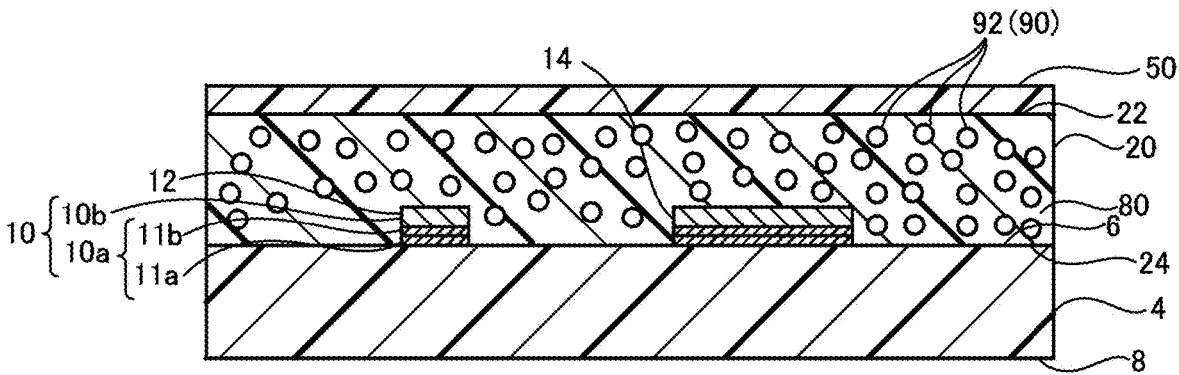
FIG. 3B is a cross-sectional view schematically illustrating a method for manufacturing a printed wiring board according to an embodiment of the present invention.
Figure 3C:
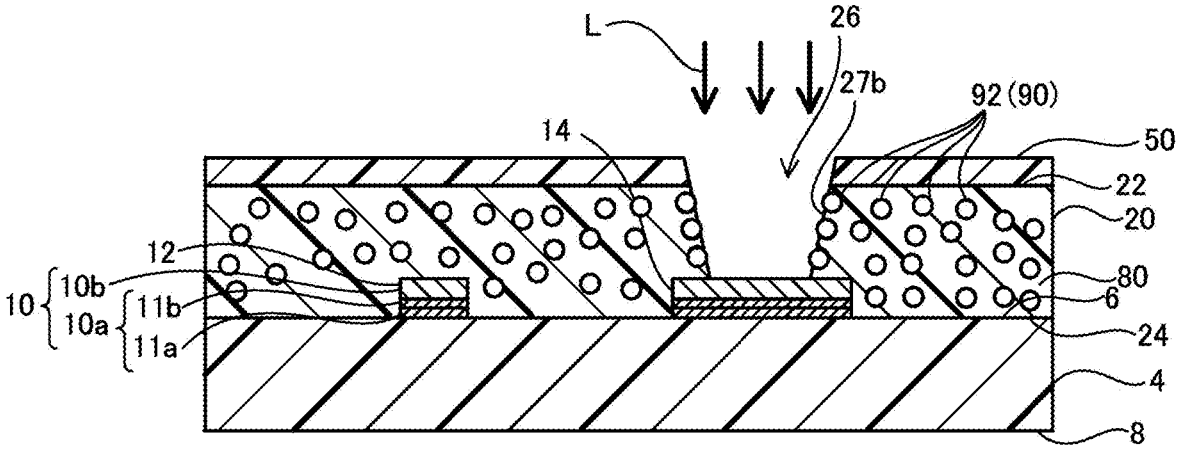
FIG. 3C is a cross-sectional view schematically illustrating a method for manufacturing a printed wiring board according to an embodiment of the present invention.
Figure 3D:
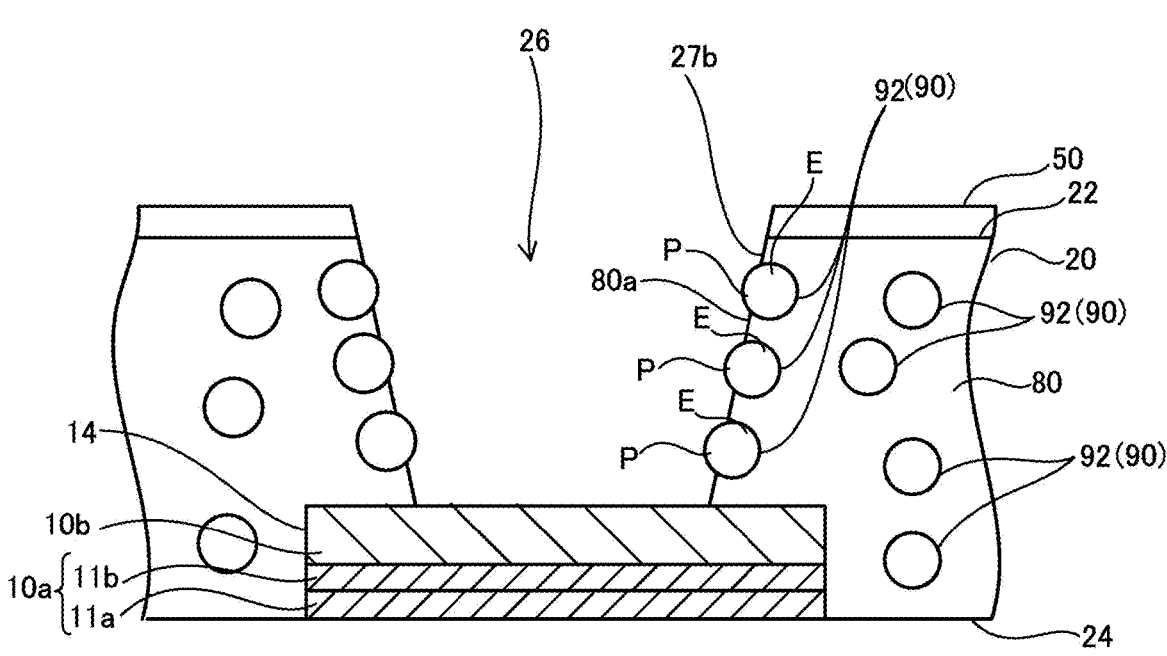
FIG. 3D is an enlarged cross-sectional view schematically illustrating a method for manufacturing a printed wiring board according to an embodiment of the present invention.

Method for Manufacturing Printed Wiring Board FIGS. 3A-3F illustrate a method for manufacturing a printed wiring board according to an embodiment of the present invention. FIGS. 3A-3C and 3E-3F are cross-sectional views. FIG. 3D is an enlarged cross-sectional view. FIG. 3A illustrates the insulating layer 4 and the first conductor layer 10 formed on the third surface 6 of the insulating layer 4. The first conductor layer 10 is formed using a semi-additive method. The first layer (11a) and the second layer (11b) are formed by sputtering. The first layer (11a) is formed of an alloy containing copper, aluminum, and a specific metal. An example of a specific metal is silicon or nickel. The second layer (11b) is formed of copper. The electrolytic plating layer (10b) is formed by electrolytic plating. The electrolytic plating layer (10b) is formed of copper.

As illustrated in FIG. 3B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 has the resin 80 and the inorganic particles 90 (the second inorganic particles 92). The inorganic particles 90 are embedded in the resin 80.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 3C, laser (L) is irradiated from above the protective film 50. The laser (L) penetrates the protective film 50 and the resin insulating layer 20 at the same time. The opening 26 for a via conductor reaching the pad 14 of the first conductor layer 10 is formed. The laser (L) is, for example, UV laser, or $CO_2$ laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 3D illustrates an inner wall surface (27b) of the opening 26 after the laser irradiation. The inner wall surface (27b) is formed of the resin 80 and the inorganic particles 90 protruding from the resin 80. In order to control a shape of the inner wall surface, the inner wall surface (27b) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27b) after the laser irradiation with a chemical. Or, the inorganic particles 90 protruding from the resin 80 are selectively removed by treating the inner wall surface (27b) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27b) after the laser irradiation, the first inorganic particles 91 having the flat parts (91a) (see FIG. 2) are obtained. By controlling conditions for treating the inner wall surface (27b) after the laser irradiation, the shape of the inner wall surface (27b) can be controlled. Examples of the conditions are a temperature, a concentration, a time, a type of gas, and a pressure. The etching rate of the inorganic particles 90 and the etching rate of the resin 80 are controlled.

By irradiating the resin insulating layer 20 with the laser (L), some of the second inorganic particles 92 embedded in the resin 80 form the inner wall surface (27b) after the laser irradiation. The second inorganic particles 92 forming the inner wall surface (27b) after the laser irradiation are each formed of a protruding portion (P) protruding from the resin 80 and a portion (E) embedded in the resin 80. The inner wall surface (27b) after the laser irradiation is treated. For example, the inner wall surface (27b) is treated with plasma of a gas containing tetrafluoromethane. The protruding portions (P) are selectively removed to form the inner wall surface 27 (FIGS. 1 and 2) of the embodiment. The first inorganic particles 91 are formed from the second inorganic particles 92. By selectively removing the protruding portions (P), the first inorganic particles 91 having the flat parts (91a) are formed. The flat parts (91a) are flat surfaces. When the second inorganic particles 92 having spherical shapes are cut along a flat surface, the shapes of the first inorganic particles 91 are obtained. The inner wall surface 27 is formed of the flat parts (91a) and the surface (80a) of the resin 80, and the exposed surfaces (91b) of the flat parts (91a) and the surface (80a) of the resin 80 are substantially positioned on the same flat surface. For example, when the seed layer (30a) is formed on the inner wall surface (27b) by sputtering, the protruding portions (P) inhibit growth of a film formed by sputtering. For example, a continuous seed layer (30a) is not formed on the inner wall surface (27b). Or, the seed layer (30a) is to be increased in thickness. A fine conductor circuit cannot be formed. In the embodiment, the projecting portions (P) are removed. The seed layer (30a) formed by sputtering can be reduced in thickness. Even when the seed layer (30a) formed by sputtering is thin, a continuous seed layer (30a) can be obtained.

Forming the opening 26 includes forming the inorganic particles 90 (the second inorganic particles 92) having the protruding portions (P). The protruding portions (P) protrude from the resin 80 that forms the inner wall surface (27b) of the opening 26. The first inorganic particles 91 are formed by removing the protruding portions (P) of the inorganic particles 90 (the second inorganic particles 92). The inner wall surface 27 of the opening 26 includes the exposed surfaces (91b) of the first inorganic particles 91. The exposed surfaces (91b) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The inner wall surface 27 of the opening 26 is actually a substantially curved surface. Since the flat parts (91a) are formed by removing the protruding portions (P), the exposed surfaces (91b) of the flat parts (91a) each include a curved surface. That is, forming a common surface with the flat parts (91a) and the resin 80 includes forming the inner wall surface 27 formed with a substantially curved surface.

No unevenness is formed on the inner wall surface 27. The inner wall surface 27 is formed smooth. By controlling the conditions for treating the inner wall surface (27b) after the laser irradiation, a size of unevenness is controlled.

The inside of the opening 26 is cleaned. By cleaning the inside of the opening 26, resin residues generated when the opening 26 is formed are removed. The cleaning of the inside of the opening 26 is performed using plasma. That is, the cleaning is performed with a dry process. The cleaning includes a desmear treatment. The first surface 22 of the resin insulating layer 20 is covered by the protective film 50, and thus, is not affected by the plasma. No unevenness is formed on the first surface 22 of the resin insulating layer 20. The first surface 22 is not roughened.

When treating the inner wall surface (27b) after the laser irradiation includes cleaning the inside of the opening 26, cleaning the inside of the opening 26 can be omitted.

Figure 3E:
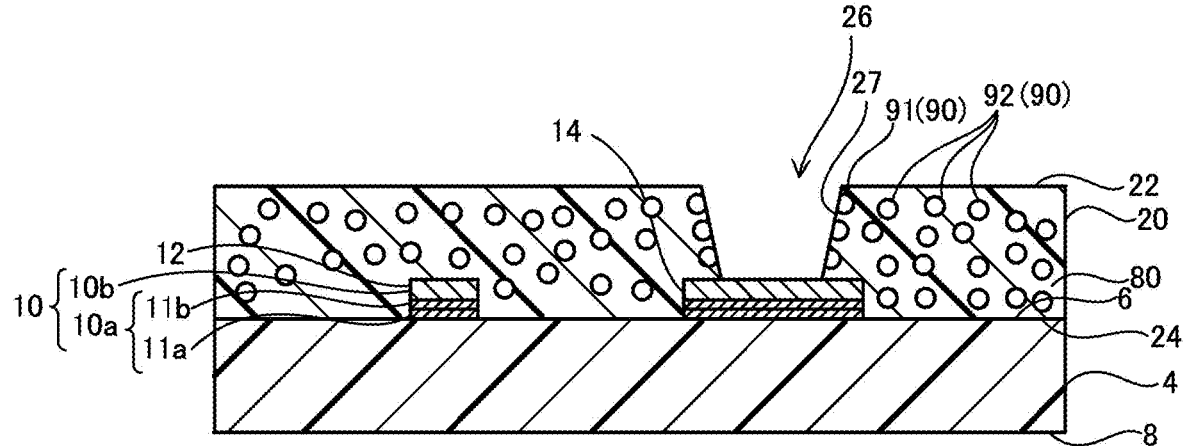
FIG. 3E is a cross-sectional view schematically illustrating a method for manufacturing a printed wiring board according to an embodiment of the present invention.

As illustrated in FIG. 3E, after cleaning the inside of the opening 26, the protective film 50 is removed from the resin insulating layer 20. When treating the inner wall surface (27b) after the laser irradiation includes cleaning the inside of the opening 26, the protective film 50 is removed from the resin insulating layer 20 after treating the inner wall surface (27b) after the laser irradiation. When the inner wall surface (27b) after the laser irradiation is treated, the protective film 50 covers the first surface 22 of the resin insulating layer 20. After the protective film 50 is removed, no roughening of the first surface 22 of the resin insulating layer 20 is performed.

Figure 3F:
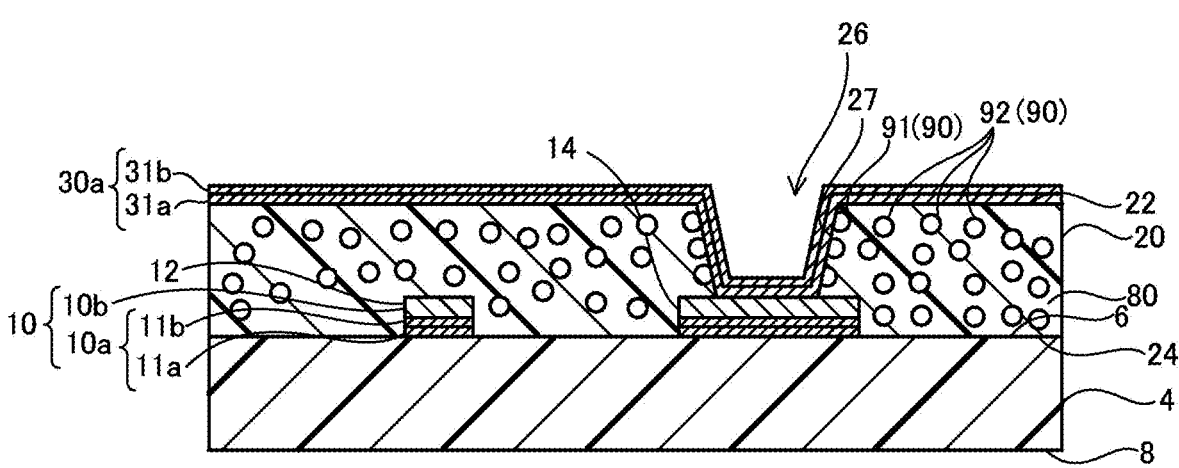
FIG. 3F is a cross-sectional view schematically illustrating a method for manufacturing a printed wiring board according to an embodiment of the present invention.

As illustrated in FIG. 3F, the seed layer (30a) is formed on the first surface 22 of the resin insulating layer 20. The seed layer (30a) is formed by sputtering. The formation of the seed layer (30a) is performed in a dry process. The seed layer (30a) is also formed on the upper surface of the pad 14 exposed from the opening 26 and on the inner wall surface 27 of the opening 26. The first layer (31a) is formed on the first surface 22 by sputtering. The first layer (31a) is formed on the inner wall surface 27 and the pad 14, which are exposed from the opening 26, by sputtering. The second layer (31b) is formed on the first layer (31a) by sputtering.

The first layer (31a) of the seed layer (30a) is formed of an alloy containing copper, aluminum and silicon. Aluminum has high ductility and high malleability. Therefore, adhesion between resin insulating layer 20 and the first layer (31a) is high. It is thought that, even when the resin insulating layer 20 expands and contracts due to heat cycles, the seed layer (30a) containing aluminum can follow the expansion and contraction. Even when the first surface 22 is smooth, the seed layer (30a) is unlikely to peel off from the resin insulating layer 20. It is thought that aluminum is easily oxidized. It is thought that, when the first inorganic particles 91 are inorganic particles 90 containing oxygen, the first layer (31a) formed on the inner wall surface 27 of the opening 26 adheres to the first inorganic particles 91 via the oxygen in the inorganic particles 90 forming the inner wall surface 27. The first layer (31a) and the inner wall surface 27 are strongly bonded to each other. Adhesion between the inner wall surface 27 of the opening 26 and the first layer (31a) can be increased. The seed layer (30a) is unlikely to peel off from the inner wall surface 27.

A plating resist is formed on the seed layer (30a). The plating resist has openings for forming the first signal wiring 32, the second signal wiring 34, and the land 36 (FIG. 1).

The electrolytic plating layer (30b) is formed on the seed layer (30a) exposed from the plating resist. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

The plating resist is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

In the printed wiring board 2 (FIGS. 1 and 2) of the embodiment, the inner wall surface 27 of the opening 26 is formed by the flat parts (91a) of the first inorganic particles 91 and the resin 80. The flat parts (93a) and a surface (80a) of the resin 80 that forms the inner wall surface 27 form a substantially common surface. The inner wall surface 27 is formed smooth. Therefore, the seed layer (30a) having a uniform thickness is formed on the inner wall surface 27 of the opening 26. The seed layer (30a) is formed thin (FIG. 3F). When the seed layer (30a) is removed, an etching amount is small. Therefore, an etching amount of the electrolytic plating layer (30b) is small. The second conductor layer 30 having the first signal wiring 32 and the second signal wiring 34 has a width as designed. A high quality printed wiring board 2 is provided.

In the printed wiring board 2 of the embodiment, the first surface 22 of the resin insulating layer 20 is formed of the resin 80. The inorganic particles 90 are not exposed on the first surface 22. No unevenness is formed on the first surface 22. An increase in standard deviation of a relative permittivity in a portion near the first surface 22 of the resin insulating layer 20 is suppressed. The relative permittivity of the first surface 22 does not significantly vary depending on a location. Even when the first signal wiring 32 and the second signal wiring 34 are in contact with the first surface 22, a difference in propagation speed of an electric signal between the first signal wiring 32 and the second signal wiring 34 can be reduced. Therefore, in the printed wiring board 2 of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of a logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. Although not illustrated in the drawings, each side of the printed wiring board 2 has a length of 50 mm or more. The length of each side is preferably 100 mm or more. The length of each side is 250 mm or less. A high quality printed wiring board 2 is provided.

In the printed wiring board 2 of the embodiment, the seed layer (30a) is formed by sputtering. Particles forming the seed layer (30a) perpendicularly collide with the first surface 22. Therefore, adhesion strength between the first surface 22 and the seed layer (30a) is high. On the other hand, particles forming the seed layer (30a) obliquely collide with the inner wall surface 27 of the opening 26. The inner wall surface 27 of the opening 26 includes the exposed surfaces (91b) of the flat parts (91a) of the first inorganic particles 91. The seed layer (30a) contains aluminum. Therefore, adhesion strength between the seed layer (30a) and the inner wall surface 27 of the opening 26 can be increased. A difference between the adhesion strength between the second conductor layer 30 and the first surface 22 and the adhesion strength between the via conductor 40 and the inner wall surface 27 of the opening 26 can be reduced. A stress is unlikely to concentrate on an interface between the second conductor layer 30 and the first surface 22. A stress is unlikely to concentrate on an interface between the via conductor 40 and the inner wall surface 27 of the opening 26. Even when the printed wiring board 2 is subjected to a thermal shock, the via conductor 40 is unlikely to peel off from the resin insulating layer 20. The second conductor layer 30 is unlikely to peel off from the resin insulating layer 20. A high quality printed wiring board 2 is provided.

First Alternative Example

Figure 4:
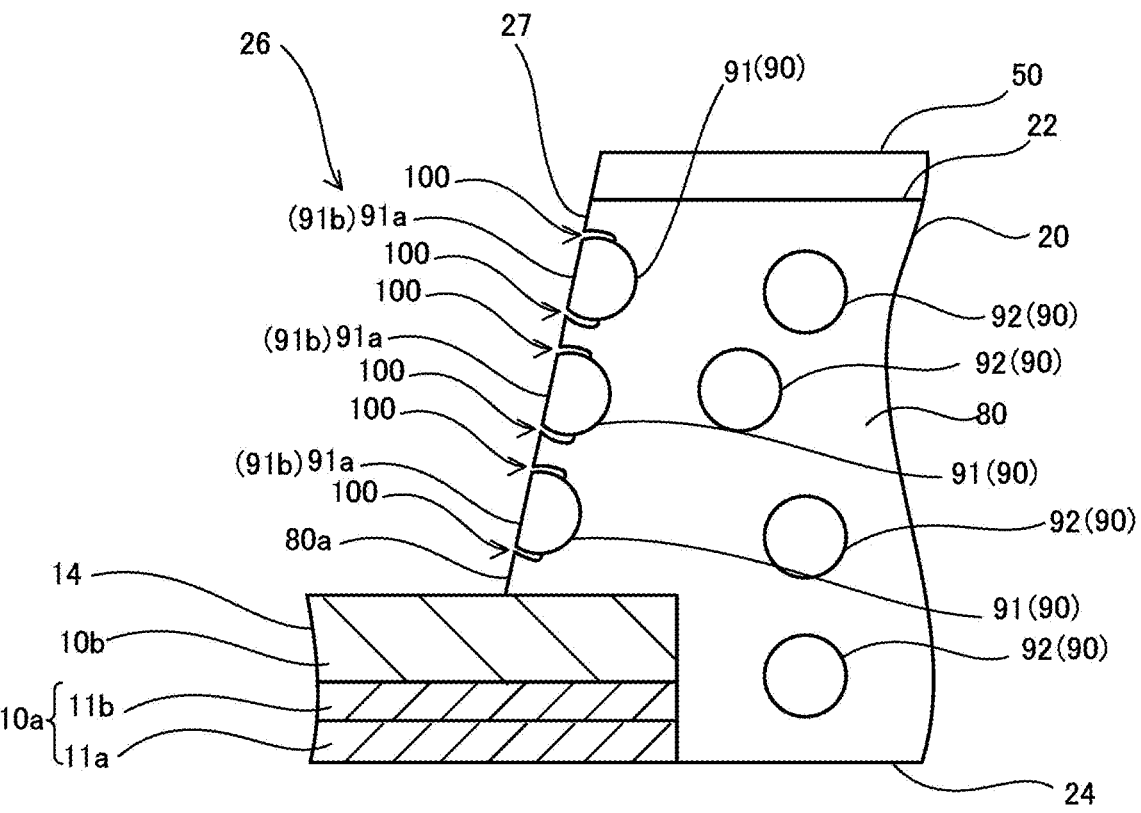
FIG. 4 is an enlarged cross-sectional view schematically illustrating a method for manufacturing a printed wiring board of a first alternative example according to an embodiment of the present invention.

In a first alternative example of the embodiment, the conditions for treating the inner wall surface (27b) after the laser irradiation are controlled. Therefore, as illustrated in FIG. 4, the flat parts (91a) and the surface (80a) of the resin 80 that forms the inner wall surface 27 form substantially the same flat surface. FIG. 4 is an enlarged cross-sectional view illustrating the inner wall surface 27 after the treatment. Distances between the exposed surfaces (91b) of the flat parts (91a) and the surface (80a) of the resin 80 are 5 μm or less. Therefore, even when there are gaps 100 between the first inorganic particles 91 and the resin 80 formed around the first inorganic particles 91, the seed layer (30a) can be formed in the gaps 100. In this case, the seed layer (30a) is formed on the inner wall surface 27 and in the gaps 100. When distances of the exposed surfaces (91b) of the flat parts (91a) from bottoms of the gaps 100 are 5 μm or less, the seed layer (30a) formed by sputtering is unlikely to peel off from the inner wall surface 27. The distances between the exposed surfaces (91b) of the flat parts (91a) and the surface (80a) of the resin 80 (widths of the gaps 100) are preferably 3 μm or less. The distances between the flat parts (91a) and the bottoms of the gaps 100 are preferably 3 μm or less. Variation in the thickness of the seed layer (30a) on the inner wall surface 27 can be reduced.

Second Alternative Example

In a second alternative example of the embodiment, the specific metal contained in the alloy forming the first layers (11a, 31a) of the seed layers (10a, 30a) is at least one of nickel, zinc, gallium, silicon, and magnesium.

Third Alternative Example

In a third alternative example of the embodiment, the alloy forming the first layers (11a, 31a) of the seed layers (10a, 30a) does not contain carbon.

Fourth Alternative Example

In a fourth alternative example of the embodiment, the alloy forming the first layers (11a, 31a) of the seed layers (10a, 30a) does not contain oxygen.

In the present specification, the term "flat surface" is used with respect to the shape of the inner wall surface 27, the shapes of the flat parts (91a), and the shapes of the first inorganic particles 91. The meaning of the "flat surface" used with respect to these is illustrated in FIGS. 1 and 2. That is, in FIGS. 1 and 2, the inner wall surface 27 is drawn substantially straight. The shape of the inner wall surface 27 in FIGS. 1 and 2 is substantially a straight line. The term "flat surface" in the present specification includes a substantially straight line illustrated in a cross section. As illustrated in the cross sections of the first inorganic particles 91 in FIGS. 1 and 2, in a cross section, cutting along a flat surface includes cutting along a straight line. The term "flat surface" in the present specification does not mean a perfect flat surface but includes a substantially flat surface. A substantially flat surface may include small unevenness.

Japanese Patent Application Laid-Open Publication No. 2015-126103 describes a printed wiring board having a first conductor layer, an insulating layer formed on the first conductor layer, and a second conductor layer formed on the insulating layer. The insulating layer has a through hole for a via conductor exposing the first conductor layer. A via conductor connecting the first conductor layer and the second conductor layer is formed in the through hole. The via conductor is formed of an electroless plating layer and an electrolytic plating layer. The insulating layer contains a resin and inorganic particles.

As illustrated in FIG. 17 of Japanese Patent Application Laid-Open Publication No. 2015-126103, in Japanese Patent Application Laid-Open Publication No. 2015-126103, an intermediate layer is provided on a wall surface (inner peripheral surface) of the through hole. The intermediate layer has a complex uneven surface due to gaps formed between the inorganic particles. The inorganic particles contained in the intermediate layer are the same as the inorganic particles contained in the insulating layer. As illustrated in FIG. 18 of Patent Document 1, in Patent Document 1, an electroless plating film is formed in the through hole. The electroless plating film follows the unevenness formed in the intermediate layer. Or, the gaps formed in the intermediate layer are filled with the electroless plating film. However, when the unevenness is complex, it is thought to be difficult to completely fill the gaps with the electroless plating film. When the electroless plating film is deposited, it is thought that a gas generated by a reaction inhibits the filling of the gaps. When the gaps are not completely filled with the electroless plated film, it is thought that voids are generated between the wall surface of the through hole and the electroless plated film. When the voids expand due to heat, it is thought that the electroless plated film is peeled off from the wall surface of the through hole.

A printed wiring board according to one aspect of the present invention includes a first conductor layer, a resin insulating layer that is formed on the first conductor layer and has an opening for a via conductor exposing the first conductor layer; a second conductor layer that is formed on the resin insulating layer, and a via conductor that is formed in the opening and connects the first conductor layer and the second conductor layer. The second conductor layer and the via conductor are formed of a seed layer and an electrolytic plating layer on the seed layer. The seed layer is formed of an alloy containing copper, aluminum, and a specific metal, and the specific metal is at least one of nickel, zinc, gallium, silicon, and magnesium. The resin insulating layer is formed of inorganic particles and a resin. The inorganic particles include first inorganic particles forming an inner wall surface of the opening and second inorganic particles embedded in the resin insulating layer, and shapes of the first inorganic particles are different from shapes of the second inorganic particles.

In a printed wiring board according to an embodiment of the present invention, the seed layer is formed of an alloy containing copper, aluminum and a specific metal. Aluminum has high ductility and high malleability. Therefore, adhesion between the resin insulating layer and the seed layer is high. Even when the resin insulating layer repeatedly expands and contracts due to heat cycles, the seed layer is unlikely to peel off from the resin insulating layer. It is thought that aluminum is easily oxidized. It is thought that the seed layer formed on the inner wall surface of the opening adheres to the inorganic particles via the oxygen in the inorganic particles (for example, glass particles) exposed on the inner wall surface. It is thought that adhesion between the inner wall surface of the opening and the seed layer is high. Further, in a printed wiring board according to an embodiment of the present invention, the first inorganic particles form the inner wall surface of the opening. And, the shapes of the first inorganic particles are different from the shapes of the second inorganic particles embedded in the resin insulating layer. For example, the shape of the inner wall surface can be controlled by changing the shapes of the first inorganic particles. The inner wall surface is a surface in contact with the via conductor. Therefore, by controlling the shape of the inner wall surface, adhesion between the via conductor and the resin insulating layer can be increased. When the via conductor includes the seed layer, the seed layer is formed on the inner wall surface. Therefore, by controlling the shape of the inner wall, a thickness of the seed layer can be reduced. Variation in the thickness of the seed layer can be reduced. Widths of conductor circuits in the second conductor layer can be close to target values.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer and comprising resin and inorganic particles;
a second conductor layer formed on the resin insulating layer and comprising a seed layer and an electrolytic plating layer formed on the seed layer; and
a via conductor formed in an opening formed in the resin insulating layer such that the via conductor is connecting the first conductor layer and the second conductor layer and includes the seed layer and electrolytic plating layer extending from the second conductor layer, wherein the second conductor layer and via conductor are formed such that the seed layer includes a first layer formed on the resin insulating layer and a second layer formed on the first layer such that the first layer comprises an alloy comprising copper, aluminum and silicon and that the second layer comprises copper, and the resin insulating layer is formed such that the inorganic particles contain oxygen and include first inorganic particles forming an inner wall surface in the opening and second inorganic particles embedded in the resin insulating layer and that shapes of the first inorganic particles are different from shapes of the second inorganic particles.

2. The printed wiring board according to claim 1, wherein the resin insulating layer is formed such that the inner wall surface in the opening includes the first inorganic particles and the resin and that the first inorganic particles have flat parts forming the inner wall surface.

3. The printed wiring board according to claim 1, wherein the resin insulating layer is formed such that the inner wall surface in the opening has an arithmetic mean roughness of 1.0 μm or less.

4. The printed wiring board according to claim 2, wherein the resin insulating layer is formed such that the inner wall surface in the opening is consisting of the resin and the flat parts of the first inorganic particles.

5. The printed wiring board according to claim 4, wherein the resin insulating layer is formed such that the inner wall surface in the opening has a common surface consisting of the flat parts of the first inorganic particles and a resin surface of the resin.

6. The printed wiring board according to claim 2, wherein the resin insulating layer is formed such that each of the second inorganic particles has a spherical shape.

7. The printed wiring board according to claim 1, wherein the second conductor layer and via conductor are formed such that the alloy of the first layer in the seed layer includes the copper in a largest content, the aluminum in a second largest content and the silicon in a content less than the second largest content of the aluminum.

8. The printed wiring board according to claim 6, wherein the resin insulating layer is formed such that the first inorganic particles have the shapes obtained by cutting the second inorganic particles along a flat surface.

9. The printed wiring board according to claim 1, wherein the second conductor layer and via conductor are formed such that the first layer in the seed layer is a film formed by sputtering and that the second layer in the seed layer is a film formed by sputtering.

10. The printed wiring board according to claim 1, wherein the second conductor layer and via conductor are formed such that a silicon content in the alloy of the first layer is in a range of 0.5 at % to 10.0 at %.

11. The printed wiring board according to claim 1, wherein the second conductor layer and via conductor are formed such that the alloy of the first layer in the seed layer has an aluminum content in a range of 1.0 at % to 15.0 at %.

12. The printed wiring board according to claim 1, wherein the second conductor layer and via conductor are formed such that the alloy of the first layer in the seed layer includes carbon and that a carbon content in the alloy is 50 ppm or less.

13. The printed wiring board according to claim 1, wherein the second conductor layer and via conductor are formed such that the alloy of the first layer in the seed layer includes oxygen and that an oxygen content in the alloy is 100 ppm or less.

14. The printed wiring board according to claim 3, wherein the second conductor layer and via conductor are formed such that a silicon content in the alloy of the first layer is in a range of 0.5 at % to 10.0 at %.

15. The printed wiring board according to claim 3, wherein the second conductor layer and via conductor are formed such that the alloy of the first layer in the seed layer has an aluminum content in a range of 1.0 at % to 15.0 at %.

16. The printed wiring board according to claim 3, wherein the second conductor layer and via conductor are formed such that the alloy of the first layer in the seed layer includes carbon and that a carbon content in the alloy is 50 ppm or less.

17. The printed wiring board according to claim 3, wherein the second conductor layer and via conductor are formed such that the alloy of the first layer in the seed layer includes oxygen and that an oxygen content in the alloy is 100 ppm or less.

18. A method for manufacturing a printed wiring board, comprising:

provides a resin insulating layer formed on a first conductor layer such that the resin insulating layer includes resin and inorganic particles;

forming an opening in the resin insulating layer such that a portion of the inorganic particles has protruding portions protruding from an inner wall surface in the opening; and removing the protruding portions of the inorganic particles such that the inorganic particles include first inorganic particles forming the inner wall surface in the opening and second inorganic particles embedded in the resin insulating layer;

forming a second conductor layer on the resin insulating layer such that the forming of the second conductor layer includes forming a seed layer and forming an electrolytic plating layer on the seed layer; and forming a via conductor in the opening formed in the resin insulating layer such that the via conductor connects the first conductor layer and the second conductor layer and includes the seed layer and electrolytic plating layer extending from the second conductor layer, wherein the second conductor layer and via conductor are formed such that the seed layer includes a first layer formed on the resin insulating layer and a second layer formed on the first layer such that the first layer comprises an alloy comprising copper, aluminum and silicon and that the second layer comprises copper, and the resin insulating layer is formed such that the inorganic particles contain oxygen and that shapes of the first inorganic particles are different from shapes of the second inorganic particles.

19. The method of claim 18, wherein the protruding portions of the inorganic particles are removed such that the first inorganic particles have exposed surfaces forming the inner wall surface in the opening of the resin insulating layer.

20. The method of claim 18, wherein the second conductor layer and via conductor are formed such that the first layer in the seed layer is formed by sputtering and that the second layer in the seed layer is formed by sputtering.

* * * * *